(12) United States Patent
Baumgartner et al.

(10) Patent No.: US 7,996,803 B2
(45) Date of Patent: Aug. 9, 2011

(54) AUTOMATED USE OF UNINTERPRETED FUNCTIONS IN SEQUENTIAL EQUIVALENCE

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 12/362,513

(22) Filed: Jan. 30, 2009

(65) Prior Publication Data

US 2010/0199241 A1 Aug. 5, 2010

(51) Int. Cl.
*G06F 17/50* (2006.01)

(52) U.S. Cl. ............... 716/107; 716/103; 716/104

(58) Field of Classification Search ............... 703/16
See application file for complete search history.

(56) References Cited

U.S. PATENT DOCUMENTS

| | | | | |
|---|---|---|---|---|
| 7,299,432 B2 * | 11/2007 | Baumgartner et al. | ....... | 716/104 |
| 7,340,694 B2 * | 3/2008 | Baumgartner et al. | ....... | 716/103 |
| 7,350,166 B2 * | 3/2008 | Baumgartner et al. | ....... | 716/103 |
| 7,350,179 B2 * | 3/2008 | Baumgartner et al. | ....... | 716/104 |
| 7,367,002 B2 * | 4/2008 | Baumgartner et al. | ....... | 716/103 |
| 7,370,298 B2 * | 5/2008 | Baumgartner et al. | ....... | 716/104 |
| 7,380,221 B2 * | 5/2008 | Baumgartner et al. | ....... | 716/134 |
| 7,689,943 B2 * | 3/2010 | Baumgartner et al. | ....... | 716/104 |
| 7,752,593 B2 * | 7/2010 | Baumgartner et al. | ....... | 716/104 |
| 7,765,514 B2 * | 7/2010 | Baumgartner et al. | ....... | 716/103 |
| 7,823,093 B2 * | 10/2010 | Baumgartner et al. | ....... | 716/132 |
| 7,831,937 B2 * | 11/2010 | Baumgartner et al. | ....... | 716/132 |
| 2006/0230366 A1 * | 10/2006 | Baumgartner et al. | ........... | 716/3 |
| 2006/0230367 A1 * | 10/2006 | Baumgartner et al. | ........... | 716/3 |
| 2006/0248481 A1 * | 11/2006 | Baumgartner et al. | ........... | 716/2 |
| 2006/0248482 A1 * | 11/2006 | Baumgartner et al. | ........... | 716/2 |
| 2006/0248483 A1 * | 11/2006 | Baumgartner et al. | ........... | 716/2 |
| 2006/0248484 A1 * | 11/2006 | Baumgartner et al. | ........... | 716/3 |
| 2006/0248494 A1 * | 11/2006 | Baumgartner et al. | ......... | 716/18 |
| 2008/0072185 A1 * | 3/2008 | Baumgartner et al. | ........... | 716/2 |
| 2008/0072186 A1 * | 3/2008 | Baumgartner et al. | ........... | 716/3 |
| 2008/0092091 A1 * | 4/2008 | Baumgartner et al. | ........... | 716/2 |
| 2008/0092104 A1 * | 4/2008 | Baumgartner et al. | ......... | 716/18 |
| 2008/0092105 A1 * | 4/2008 | Baumgartner et al. | ......... | 716/18 |
| 2008/0104560 A1 * | 5/2008 | Baumgartner et al. | ........... | 716/5 |
| 2008/0109769 A1 * | 5/2008 | Baumgartner et al. | ........... | 716/3 |
| 2008/0109774 A1 * | 5/2008 | Baumgartner et al. | ........... | 716/5 |

(Continued)

OTHER PUBLICATIONS

Sandireddy et al., Diagnostic and Detection Fault Collapsing for Multiple Output Circuits, Proceedings of the Design, Automation and Test in Europe Conference and Exhibition, 2005, pp. 1-6.*

(Continued)

*Primary Examiner* — Phallaka Kik
(74) *Attorney, Agent, or Firm* — Dillon & Yudell LLP

(57) ABSTRACT

A method, system and computer program product for automated use of uninterpreted functions in sequential equivalence checking. A first netlist and a second netlist may be received and be included in an original model, and from the original model, logic to be abstracted may be determined. A condition for functional consistency may be determined, and an abstract model may be created by replacing the logic with abstracted logic using one or more uninterpreted functions. One or more functions may be performed on the abstract model. For example, the one or more functions may include one or more of a bounded model checking (BMC) algorithm, an interpolation algorithm, a Boolean satisfiability-based analysis algorithm, and a binary decision diagram (BDD) based reachability analysis algorithm, among others.

19 Claims, 4 Drawing Sheets

U.S. PATENT DOCUMENTS

2008/0109781 A1* 5/2008 Baumgartner et al. ......... 716/12
2008/0235637 A1* 9/2008 Baumgartner et al. ........... 716/4
2009/0100385 A1* 4/2009 Baumgartner et al. ........... 716/2

OTHER PUBLICATIONS

Andres Kuehlmann and Jason Baumgartner, Transformation-Based Verification Using Generalized Retiming, Cadence Berkeley Labs, Berkeley, CA and IBM Enterprise Systems Group, Austin, TX, 13 pages.

Jason Baumgartner et al., Scalable Sequential Equivalence Checking Across Arbitrary Design Transformers, IBM Systems & Technology Group and IBM Research Division, International Conference on Computer Design, Oct. 1-4, 2007, pp. 259-266.

Randal E. Bryant et al., Exploiting Positive Equality in a Logic of Equality with Uninterpreted Functions, Carnegie Mellon University, Pittsburgh, VA and IBM Watson Research Center, Yorktown Hts., NY, Computer Aided Verification, 1999, 13 pages.

* cited by examiner

AUTOMATED USE OF UNINTERPRETED FUNCTIONS IN SEQUENTIAL EQUIVALENCE

BACKGROUND

1. Technical Field

The present invention generally relates to sequential equivalence checking and in particular to using sequential equivalence checking to verify performance of clock gating designs.

2. Description of the Related Art

Sequential equivalence checking (SEC) solutions are increasingly being used to perform a wide variety of verification tasks. These verification tasks range from the most common application of SEC proving that sequential transformations late in the design phase do not change design functionality to proving that partial good self-test fencing structures work correctly. SEC performs a true sequential check of input/output equivalence, hence unlike more prevalent combinational equivalence checking solutions, the equivalence check is not limited to operating on designs with 1:1 state element pairings; however, with this generality in equivalence checking comes with higher computational expense of the SEC algorithms. For scalability of SEC, it is often required that a substantial number of internal equivalence points exist between the two designs.

One or more SEC solutions can be used to verification of designs that have one or more portions shut off for one or more periods of time (e.g., during periods of inactivity) while other portions of the design are in operation. This is known as clock gating, and clock gating can be used to conserve power, which power consumption can be a factor in designing modern processors. In clock gating verification, one goal is to verify the control logic that implements clock gating, while other functionality of a design being clock gated are not important; However, clock gating introduces verification complexity as the logic for turning off the clocks adds new states and increases the complexity of the design. One approach for verifying a clock gating transformation is to perform a sequential equivalence check between the "design with clock gating enabled" and the "design with clock gating disabled". The sequential equivalence check is performed to verify that the two designs are input/output equivalent under the "care" (as opposed to "don't care") conditions when the design is required to produce valid outputs, but this sequential equivalence check is very complex since there are virtually no equivalent internal gates across the two designs being verified. For instance, the logic is equivalent only under the "care" conditions. Due to the lack of internal equivalence, equivalence checking algorithms tend to become intractable since no internal points may be merged to simplify the overall input/output equivalence check.

SUMMARY OF ILLUSTRATIVE EMBODIMENTS

Disclosed are a method, a system and a computer program product for automated use of uninterpreted functions in sequential equivalence checking in a data processing system. An Uninterpreted Function Sequential Equivalence Checking (UIFSEC) utility (which executes on the data processing system) receives a first netlist and a second netlist of an original model, and from the original model, the UIFSEC utility determines logic to be abstracted. The UIFSEC utility determines a condition for functional consistency and creates an abstract model by replacing the logic with abstracted logic using one or more uninterpreted functions. The UIFSEC utility performs one or more functions on the abstract model. For example, the one or more functions may include one or more of a bounded model checking (BMC) algorithm, an interpolation algorithm, a Boolean satisfiability-based analysis algorithm, and/or a binary decision diagram (BDD) based reachability analysis algorithm, among others. From performing the one or more functions on the abstract model, the UIFSEC utility determines whether or not a counterexample is obtained. If a counterexample is not obtained, the UIFSEC utility determines whether or not a proof is complete. If the proof is complete, the UIFSEC utility reports that the proof is complete. If the proof is not complete, the UIFSEC utility performs another function on the abstract model, where the other function is different from any function previously used on the abstract model. If a counterexample is obtained, the UIFSEC utility determines whether or not the counterexample can be transferred onto the original model. If the counterexample can be transferred onto the original model, the UIFSEC utility reports that the counterexample can be transferred onto the original model and reports the counterexample. If the counterexample can not be transferred onto the original model, the UIFSEC utility refines the abstraction and performs the one or more functions on the abstract model with the refined abstraction, again.

The above as well as additional objectives, features, and advantages of the present invention will become apparent in the following detailed written description.

BRIEF DESCRIPTION OF THE DRAWINGS

The invention itself, as well as advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
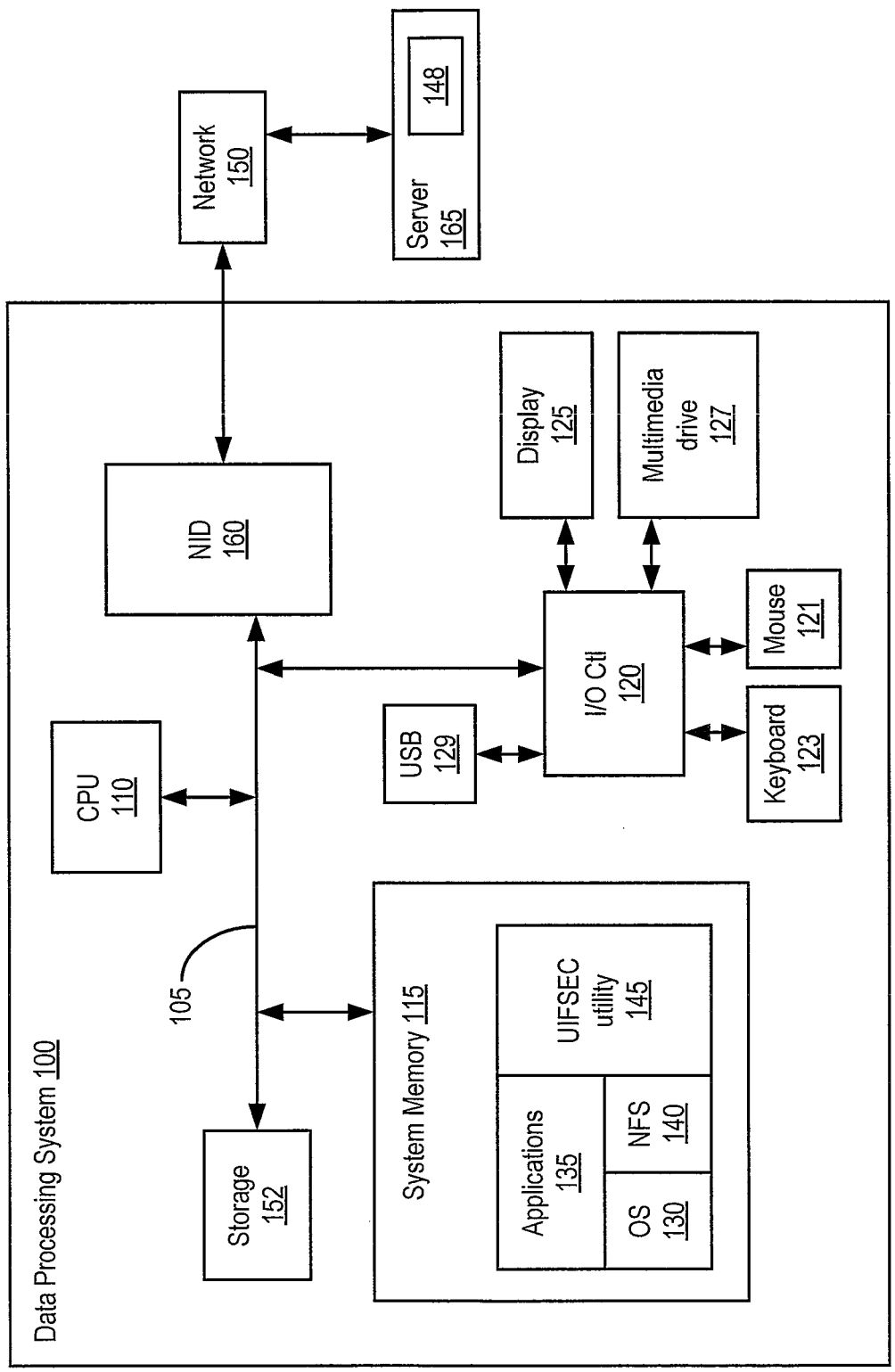
FIG. 1 provides a block diagram of a data processing system configured with hardware and software components for implementing one or more embodiments of the present invention.

The illustrative embodiments provide a method, system and computer program product for automated use of uninterpreted functions in sequential equivalence checking. An Uninterpreted Function Sequential Equivalence Checking (UIFSEC) utility (which executes on a data processing system) receives a first netlist and a second netlist of an original model, and from the original model, the UIFSEC utility determines logic to be abstracted. The UIFSEC utility determines a condition for functional consistency and creates an abstract model by replacing the logic with abstracted logic using one or more uninterpreted functions. The UIFSEC utility performs one or more functions on the abstract model (e.g., to complete a proof). For example, the one or more functions may include one or more of a bounded model checking (BMC) algorithm, an interpolation algorithm, a Boolean satisfiability-based analysis algorithm, and/or a binary decision diagram (BDD) based reachability analysis algorithm, among others. From performing the one or more functions on the abstract model, the UIFSEC utility determines whether or not a counterexample is obtained. If a counterexample is not obtained, the UIFSEC utility determines whether or not a proof is complete. If the proof is complete, the UIFSEC utility reports that the proof is complete. If the proof is not complete, the UIFSEC utility performs another function on the abstract model, where the other function is different from any function previously used on the abstract model. If a counterexample is obtained, the UIFSEC utility determines whether or not the counterexample can be transferred onto the original model. If the counterexample can be transferred onto the original model, the UIFSEC utility reports that the counterexample can be transferred onto the original model and reports the counterexample. If the counterexample can not be transferred onto the original model, the UIFSEC utility refines the abstraction and performs the one or more functions on the abstract model with the refined abstraction, again.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized. Specifically, as utilized herein, a netlist includes a directed graph with vertices representing gates and with edges representing interconnections between the gates. The gates may include and/or be associated with functions, such as constants, primary inputs (hereafter referred to as "random" gates), combinational logic such as AND gates, and/or sequential elements (hereafter referred to as registers or latches), among others. A register or latch includes associated components: a next-state function and an initial-value function. Both are represented as other gates in the graph. Semantically, for a given register, a value appearing at its initial-value gate at time "0" ("initialization" or "reset" time) will be applied as the value of the register itself, and a value appearing at its next-state function gate at time "i" will be applied to the register itself at time "i+1". A netlist with no registers may be referred to as "combinational". A multiplexor is a type of combinational gate with three inputs: one selector input and two data inputs. For example, when the selector evaluates to "0", the multiplexor will output the value on data input "0" and when the selector evaluates to "1", the multiplexor will output the value on data input "1". Certain gates in a netlist may be labeled as "targets". Targets correlate to the properties to be verified. A goal of the verification process is to find a way to drive a "1" to a target node (and to generate a "trace" illustrating this scenario if one is found) or to prove that no such assertion of the target is possible.

With reference now to the figures, and beginning with FIG. 1, there is depicted a block diagram representation of an example data processing system (DPS) 100, as utilized within one or more embodiments. DPS 100 may be a computer, a portable device, such as a personal digital assistant (PDA), a smart phone, and/or other types of electronic devices that may generally be considered processing devices. As illustrated, DPS 100 includes at least one processor or central processing unit (CPU) 110 connected to a system memory 115 via a system interconnect/bus 105. Also connected to system bus 105 is an input/output (I/O) controller 120, which provides connectivity and control for input devices, of which a pointing device (or mouse) 121 and a keyboard 123 are illustrated. I/O controller 120 also provides connectivity and control for output devices, of which a display 125 is illustrated. Additionally, a multimedia drive 127 (e.g., a compact disk read/write (CDRW), a digital video disk (DVD) drive, etc.) and an USB (universal serial bus) port 129 are illustrated, coupled to I/O controller 120. Multimedia drive 127 and USB port 129 enable insertion of a removable storage device (e.g., optical disk or "thumb" drive) on which data/instructions/code may be stored and/or from which data/instructions/code may be retrieved. DPS 100 also includes a storage 152, within/from which data/instructions/code may also be stored/retrieved.

DPS 100 is also illustrated with a network interface device (NID) 160, by which DPS 100 may connect to one or more networks, such as a network 150. In one or more embodiments, network 150 may include and/or be coupled to another network, such as a wide area network (e.g., a wide area corporate network, the Internet, etc.), a local area network (LAN), or a virtual private network (VPN), among others. In one embodiment, the Internet represents/is a worldwide collection of networks and gateways that may utilize one or more protocols (e.g., Internet Protocol (IP), Transmission Control Protocol (TCP), User Datagram Protocol (UDP), Internet Control Message Protocol (ICMP), etc.). NID 160 may be configured to operate via a wired and/or wireless connection to an access point of one or more networks. A connection to network 150 may be utilized to establish with one or more servers, such as a server 165. In one embodiment, server 165 provides one or more of data, instructions, and code for execution on DPS 100.

In addition to the above described hardware components of DPS 100, various features of the invention are completed/supported via software (or firmware) code or logic stored within memory 115 or other storage (e.g., storage 152) and executed by CPU 110. Thus, for example, illustrated within memory 115 are a number of software/firmware/logic components, including an operating system (OS) 130 (e.g., Microsoft Windows® (a trademark of Microsoft Corp), GNU®/Linux® (a registered trademarks of the Free Software Foundation and The Linux Mark Institute), etc.), an application 135, and UIFSEC utility 145 which executes on CPU 110 to provide automated use of uninterpreted functions in sequential equivalence checking. In one or more embodiments, UIFSEC utility 145 may be combined with or incorporated within application 135 to provide a single executable component, collectively providing the various functions of each individual software component when the corresponding combined code is executed by the CPU 110. For simplicity, UIFSEC utility 145 is illustrated and described as a stand alone or separate software/firmware component, which provides specific functions, as described below.

In one embodiment, server 165 includes a software deploying server, and DPS 100 communicates with the software deploying server 165 via network 150 using network interface 160. In one example, an UIFSEC utility 148 (which may include various functionalities associated with UIFSEC utility 145) of server 165 may be deployed from/on network 150, via software deploying server 165. With this configuration, software-deploying server 165 performs all or almost all of the functions associated with the execution of UIFSEC utility 148. Accordingly, DPS 100 is not required to utilize internal computing resources of DPS 100 to execute UIFSEC utility 148. For example, UIFSEC utility 148 is executed on server 165, while user interactions (e.g., via keyboard, mouse, display, etc.) are conducted through DPS 100 and communicated via between server 165 and DPS 100 via network 150.

In one embodiment, UIFSEC utility 148 may be accessed through network 150 using a network file system (NFS) 140, where CPU 110 executes instructions of UIFSEC utility 148 as they are received from software deploying server 165 via network 150. CPU 110 executes UIFSEC utility 145 as well as OS 130, which supports the user interface features of UIFSEC utility 145. In one or more embodiments, UIFSEC utility 145 generates/provides several graphical user interfaces (GUI) to enable user interaction with, or manipulation of, the functional features of UIFSEC utility 145. Certain functions supported and/or implemented by UIFSEC utility 145 generate processing logic executed by processor and/or device hardware to complete the implementation of that function. For simplicity of the description, the collective body of code that enables these various features is referred to herein as UIFSEC utility 145. The software code/instructions/logic provided by UIFSEC utility 145, and which are specific to the invention, include: (a) code/logic for receiving a first netlist and a second netlist; (b) code/logic for determining, from an original model, logic to be abstracted, wherein the original model includes the first netlist and the second netlist; (c) code/logic for determining a condition for functional consistency; (d) code/logic for creating an abstract model by replacing the logic with abstracted logic using one or more uninterpreted functions; (e) code/logic for performing one or more functions on the abstract model; (f) code/logic for determining whether or not a counterexample is obtained from said performing the one or more functions on the abstract model; (g) code/logic for if a counter example is not obtained, determining whether or not a proof is complete; (h) code/logic for if the proof is complete, reporting that the proof is complete; (i) code/logic for if the proof is not complete, repeating from (e) using another function on the abstract model, wherein the other function is different from any one or more functions previously used in (e); (j) code/logic for if a counter example is obtained, determining whether or not the counter example can be transferred onto the original model; (k) code/logic for if the counter example can be transferred onto the original model, reporting that the counter example can be transferred onto the original model and reporting the counter example; and (l) code/logic for if the counter example can not be transferred onto the original model: refining the abstraction and repeating (e) with the abstract model including the refined abstraction. According, in one or more embodiments, when CPU 110 executes UIFSEC utility 145, DPS 100 initiates a series of functional processes that enable the above functional features as well as additional features/functionality. These features/functionality are described in greater detail below within the description of FIGS. 2-6.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system. In one or more alternative embodiments, the data processing system depicted in FIG. 1 may be, for instance, a virtual machine.

Figure 2:
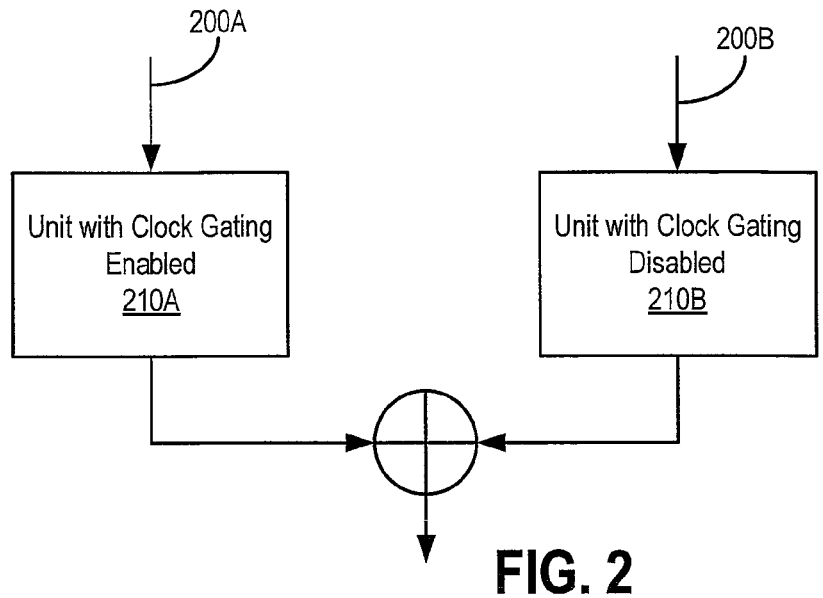
FIG. 2 illustrates a block diagram of an exemplary clock gating verification setup, in accordance with an embodiment of the present invention.

With reference now to FIG. 2, a block diagram of an exemplary clock gating verification setup is illustrated. In verifying that clock gating has been correctly implemented for a particular unit, two designs are considered: a unit with clock gating enabled 210A and a unit with clock gating disabled 210B, as shown. For instance, unit 210B is unit 210A with clock gating disabled. Inputs 200A and 200B are applied to respective units 210A and 210B, as shown. With this setup, UIFSEC utility 145 performs a sequential equivalence check to verify that the two designs (units 210A and 210B) are input/output equivalent under the "care" conditions.

Figure 3:
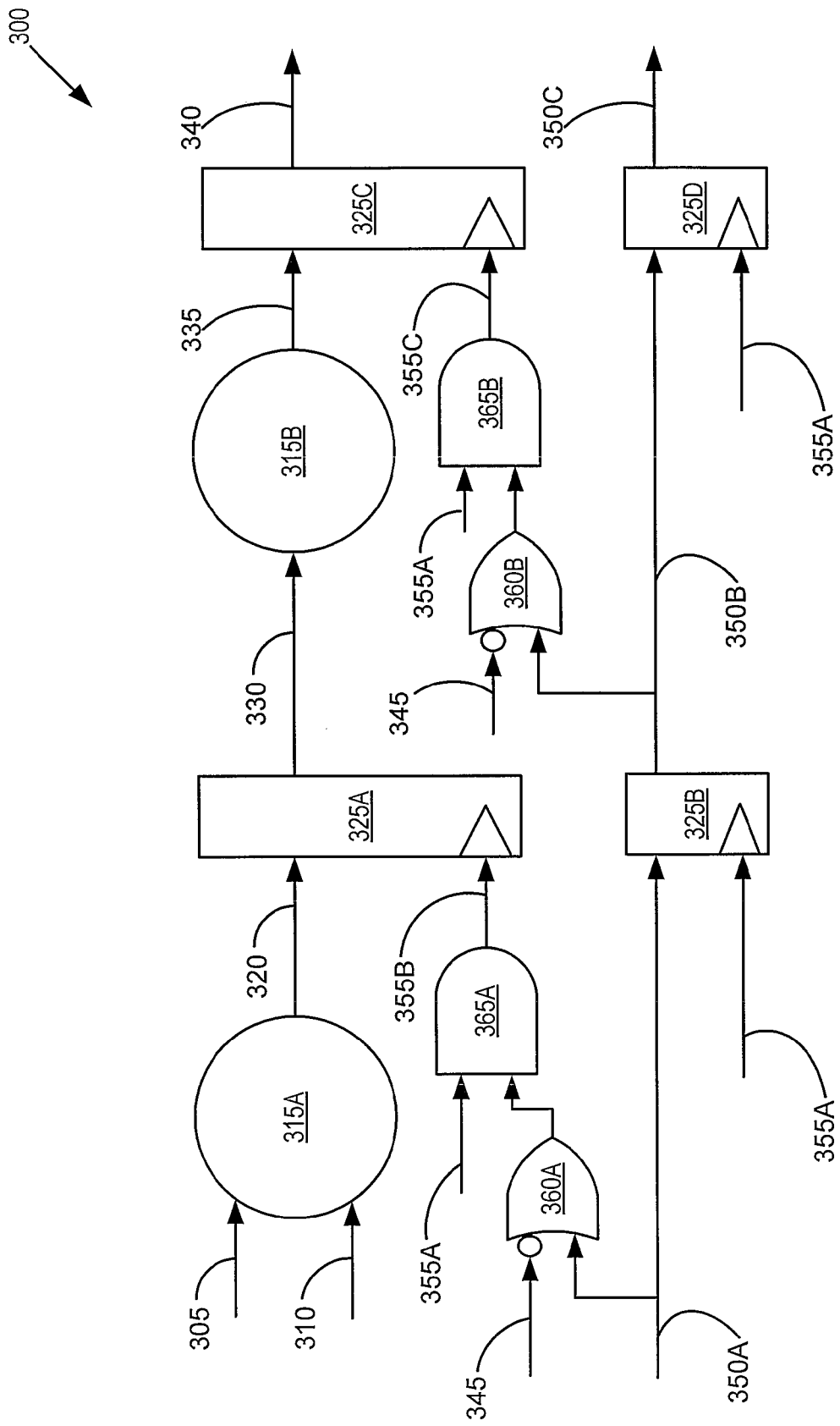
FIG. 3 illustrates a block diagram of an exemplary netlist, in accordance with an embodiment of the present invention.

With reference now to FIG. 3, a block diagram of an exemplary netlist 300 is illustrated. In one embodiment, each of units 210A and 210B include netlist 300, and UIFSEC utility 145 uses netlist 300 in performing its functionality. In one or more embodiments, netlist 300 includes at least two stages of a pipelined process. As shown, netlist 300 includes a logic unit 315A (e.g., combinational logic, a multiplier, etc.) that accepts an opcode 305 and an operand 310. For example, each of opcode 305 and operand 310 includes a multi-bit signal, and input signal 200A and/or input signal 200B is applied as opcode 305 and operand 310. Logic unit 315A responds to and/or processes opcode 305 and operand 310 to produce an output 320 (e.g., an one or more bits signal). In one or more embodiments, logic unit 315A processes opcode 305 and operand 310 to produce output 320 during an amount of time transpiring. For example, output 320 may be considered valid (or stable) when opcode 305 and operand 310 have been applied to logic unit 315A and following a transpiration of at least two clock cycles. As shown, netlist 300 includes a latch or register 325A that accepts output 320 and passes the value of output 320 to input 330 when a signal 355B (e.g., a modified clock signal) is applied.

In an embodiment, it may only be of interest in the working of netlist 300 for one or more opcodes (e.g., a subset of an instruction set architecture). For example, netlist 300 may be included in another netlist, and while one or more opcodes may be valid for the other netlist, the one or more opcodes may not be valid for netlist 300. For instance, the one or more opcodes that are not be considered valid for netlist 300 may be included in an instruction set architecture (ISA) that netlist 300 does not implement but another netlist implements those one or more opcodes that are not be considered valid for netlist 300. In conserving power and implementing clock gating, a clock signal may be suppressed or "turned off" during an opcode that is not valid to netlist 300 or a portion of netlist 300. Thus, signal 355B can be based on a clock signal 355A and an instruction valid signal 350A. For example, the instruction valid signal may only be asserted when the opcode is valid. As shown, netlist 300 includes a gate 360A (e.g., an OR gate with one inverting input) that accepts a clock gating enable signal 345 and instruction valid signal 350A. Netlist 300 includes a gate 365A (e.g., an AND gate) that accepts a signal from gate 360A and clock signal 355A to produce modified clock signal 355B. Accordingly, when clock gating enable signal 345 is asserted and the instruction valid signal 350A is not asserted, register 325A does not pass output 320 to input 330, since modified clock signal 355B is not asserted under these conditions. Power may be conserved by not passing output 320 to input 330.

As also shown, netlist 300 includes a logic unit 315B (e.g., combinational logic, a multiplier, etc.) that accepts input 330 and responds to and/or processes input 330 to produce an output 335 (e.g., an one or more bits signal). Moreover, netlist 300 includes a latch or register 325C that may be passed a value of output 335 to input 340 when a modified clock signal 355C is asserted. Netlist 300 includes a latch or register 325B that may pass instruction valid signal 350A to an instruction valid signal 350B when clock signal 355A is asserted. Signal 355C may be based on clock signal 355A and instruction valid signal 350B. For example, the instruction valid signal may only be asserted when the opcode is valid (e.g., for this pipeline stage). As shown, netlist 300 includes a gate 360B (e.g., an OR gate with one inverting input) that accepts a clock gating enable signal 345 and instruction valid signal 350B. Netlist 300 includes a gate 365B (e.g., an AND gate) that accepts a signal from gate 360B and clock signal 355A to produce modified clock signal 355C. Accordingly, when clock gating enable signal 345 is asserted and the instruction valid signal 350B is not asserted, register 325C does not pass output 335 to input 340, since modified clock signal 355C is not asserted under these conditions. Power may be conserved by not passing output 335 to input 340. Netlist 300 also includes a latch or register 325D that passes instruction valid signal 350B to an instruction valid signal 350C when clock signal 355A is asserted.

Figure 4:
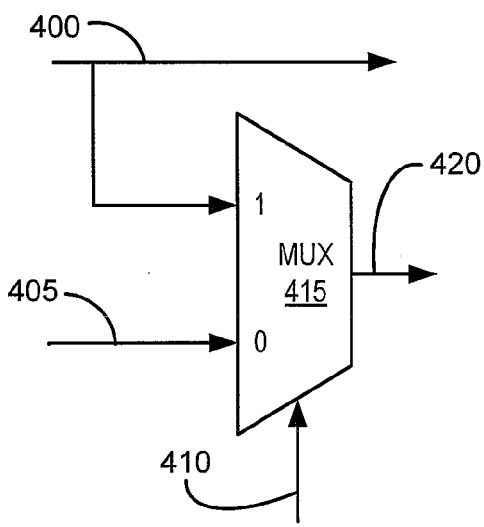
FIG. 4 illustrates a block diagram of an exemplary abstraction, in accordance with an embodiment of the present invention.

With reference now to FIG. 4, a block diagram of an exemplary abstraction is illustrated. In the abstraction, output signal 320 (see FIG. 3) is driven by a data signal 400 when clock gating enable signal 345 is asserted as in unit 210A (see FIG. 2), and when clock gating signal is not asserted as in unit 210B, output signal 320 may be driven by a multiplexor (MUX) 415 that accepts control a signal 410 and data signals 400 and 405. Data signals 400 and 405 communicate different data.

MUX 415 outputs data signal 400 as a data signal 420 if functional consistency needs to be maintained (inputs 200A and 200B are the same in both units 210A and 210B). For all other cases, MUX 415 outputs data signal 405 as data signal 420. By injecting data signal 400 in both units 210A and 210B when inputs 200A and 200B are equivalent, versus a case where inputs 200A and 200B are different, original logic (e.g., actual logic for unit 315A) may be eliminated. This may be beneficial, since unit 315A can be arbitrarily complex (e.g., unit 315A can include one or more multipliers, which can be challenging for formal reasoning and/or equivalence checking). Abstracting unit 315B can be performed in the same way as described with reference to the abstraction of FIG. 4.

Abstracting logic units 315A and 315B using uninterpreted functions may appear to be straightforward. However, in practice it becomes very manually intensive to identify not only the logic that can be abstracted away using uninterpreted functions, but also the conditions under which the abstracted logic must be equivalent. This is partially due to the fact that verification may often be performed at a bit level, where control signals and data signals intermix and can become very difficult to separate the control signals and the data signals.

Further details abstracting logic in a netlist using uninterpreted functions are described below with reference to FIGS. 5 and 6.

Figure 5:
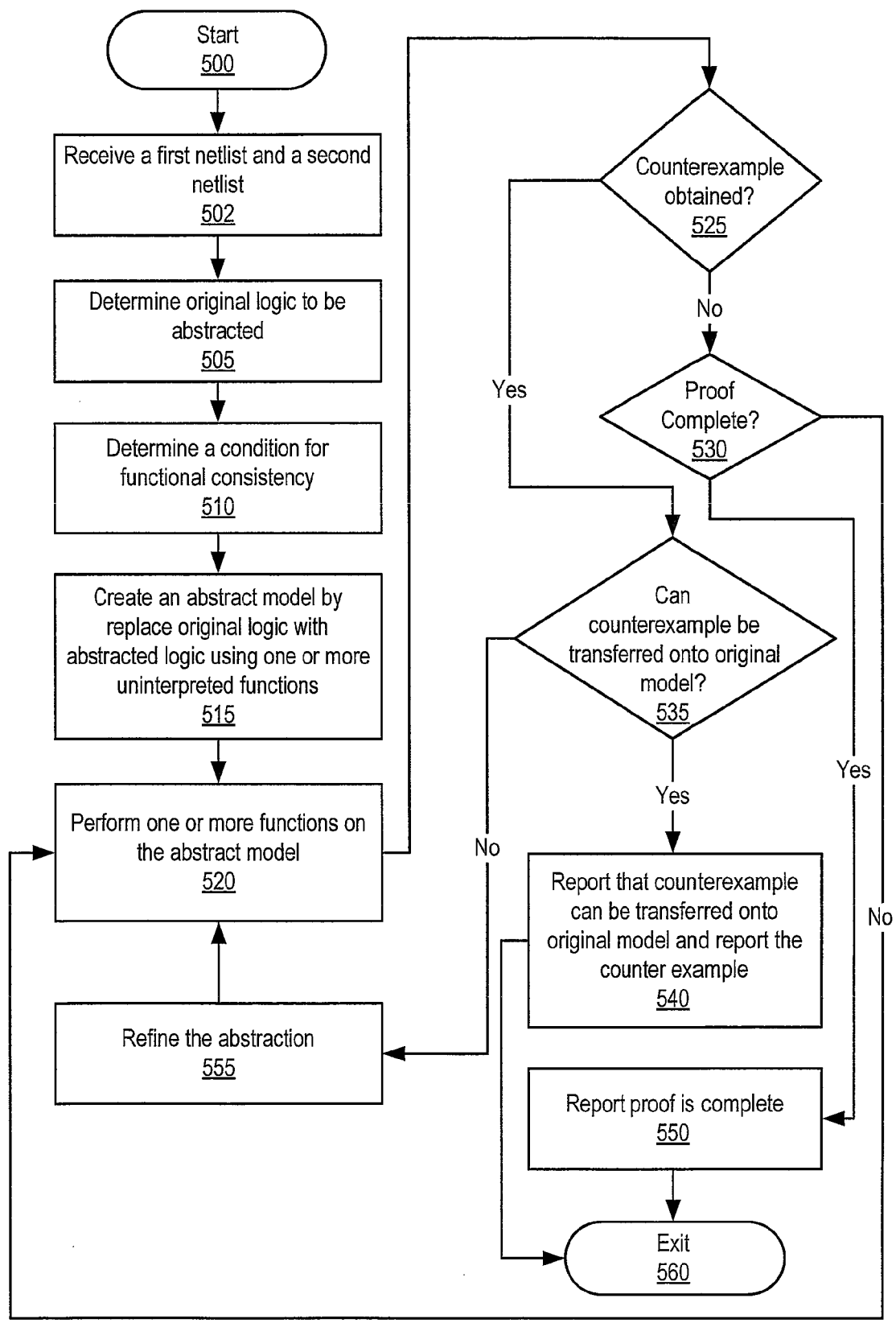
FIG. 5 illustrates a method for automated use of uninterpreted functions in sequential equivalence checking in a data processing system, in accordance with an embodiment of the present invention.

Turning now to FIG. 5, a method for automated use of uninterpreted functions in sequential equivalence checking is illustrated. FIG. 5 is a flow chart illustrating a method by which the discussion of illustrative embodiments are completed. Although the method illustrated in FIG. 5 may be described with reference to components shown in FIGS. 1-4 and 6, it should be understood that this is merely for convenience and alternative components and/or configurations thereof can be employed when implementing the various methods. Key portions of the methods may be completed by UIFSEC utility 145 executing on processor 110 within DPS 100 and controlling specific operations of/on DPS 100, and the method is thus described from the perspective of either/both UIFSEC utility 145 and DPS 100.

The method begins at 500 and proceeds to 502 where UIFSEC utility 145 receives a first netlist and a second netlist. For example, the first netlist may include a netlist of unit 210A and the second netlist may include a netlist of unit 210B. In one or more embodiments, each of units 210A and 210B includes netlist 300. At 505 UIFSEC utility 145 abstracts original logic from an original model. For example, the original model includes netlist 300. For instance, the original logic may include logic unit 315A and/or logic unit 315B which may be abstracted. In determining the logic to be abstracted, UIFSEC utility 145 determines a first register in the first netlist and a corresponding second register in the second list. For instance, the first register may be a register of unit 210A corresponding to register 325A, and the second register may be a register of unit 210B corresponding to register 325A. Also in determining the logic to be abstracted, UIFSEC utility 145 determines: a first next-state function of the first register; a second next-state function of the second register; a cone of influence (COI) of the first next-state function and the second next-state function; and correlating signals that are different from the first register and the second register. In one or more embodiments, UIFSEC utility 145 performs correlating signals that are different from the first register and the second register by walking the COI. In some instances, determining the COI of the first next-state function and the second next-state function includes discarding each register of one or more registers, where a next-state function of the register is the register. In various instances, UIFSEC utility 145 receives user input that specifies a number of support signals in the COI and determining the COI of the first next-state function and the second next-state function includes discarding support signals below the number.

At 510, UIFSEC utility 145 determines a condition for consistency. In one or more embodiments, determining the condition for consistency includes determining that the first next-state function of the first register and the second next-state function of the second register are functionally equivalent when the first next-state function of the first register and the second next-state function of the second register receive a same input. For example, inputs 200A and 200B may include the same value when determining that the first next-state function of the first register and the second next-state function of the second register are functionally equivalent. In some instances, determining that the first next-state function of the first register and the second next-state function of the second register are functionally equivalent may include using a Boolean satisfiability-based (SAT-based) analysis. In various instances, determining that the first next-state function of the first register and the second next-state function of the second register are functionally equivalent may include using a binary decision diagram. Determining the condition for consistency may also be based on correlated signals in support of the COI of the first next-state function and the second next-state function and based on the first next-state function of the first register and the second next-state function of the second register being functionally equivalent.

At 515, UIFSEC utility 145 creates an abstract model by replacing the original logic with abstracted logic. For example, the original logic or at least a portion of the original logic may be replaced with a MUX, such as MUX 415. In one instance, at least one of the first abstract logic and the second abstract logic may include a multiplexor-based uninterpreted function (UIF). In another instance, logic unit 315A may be replaced by MUX 415. In one or more embodiments, a data structure is populated with information associated with one or more UIF abstractions. For example, the data structure may be stored in a memory and/or a storage, such as system memory 115, storage 152, network storage, etc. In creating the abstract model, UIFSEC utility 145 searches the data structure for an UIF abstraction, UIFSEC utility 145 determines that the UIF abstraction does not exist in the data structure, and after determining that the UIF abstraction does not exist in the data structure, UIFSEC utility 145 populates the data structure with the UIF-abstraction and/or information associated with the UIF abstraction. For example, the UIF abstraction may include the first abstract logic or the second abstract logic.

At 520, in one or more embodiments, UIFSEC utility 145 performs one or more functions as proof on the abstract model. For example, the one or more functions may include one or more of a bounded model checking (BMC) algorithm, an interpolation algorithm, a binary decision diagram (BDD) based reachability analysis algorithm, and/or, a Boolean satisfiability-based analysis algorithm, among others. At 525, UIFSEC utility 145 determines whether or not a counterexample was obtained from performing the one or more functions on the abstract model. For example, the Boolean satisfiability-based analysis algorithm may be performed to determine whether or not a counterexample was obtained.

If a counterexample was not obtained, the method proceeds to 530 where UIFSEC utility 145 determines if the proof is complete. If the proof is complete, UIFSEC utility 145 reports that the proof is complete and proceeds to and ends at 560. If the proof not complete, UIFSEC utility 145 proceeds to 520 where another function is performed on the abstract model, and portions of the method may repeat from 520.

If a counterexample was obtained, the method proceeds to 535, where UIFSEC utility 145 determines whether or not the counterexample can be transferred onto the original model. In determining whether or not the counterexample can be transferred onto the original model, for instance, the counterexample may be reconstructed on the original logic by extracting input valuations from the counterexample and re-simulating the input valuations from the counterexample on the original logic to obtain a simulated trace.

If the counterexample can be transferred onto the original model, the method proceeds to 540 where UIFSEC utility 145 reports that the counterexample can be transferred onto the original model and reports the counter example, and the method proceeds to ends at 560. If the counter example cannot be transferred onto the original model, then the counter example is spurious, and the method proceeds to the method proceeds to 555 where the abstraction may be refined, and the method proceeds to 520 where UIFSEC utility 145 repeats performing the one or more functions to complete the proof on the abstract model. In one or more embodiments, determining whether or not the counterexample can be transferred onto the original model may include determining whether or not the simulated trace exhibits a failure. For instance, the failure may be caused by the abstraction alone.

In one or more embodiments, UIFSEC utility 145 reports information, and in reporting the information, UIFSEC utility 145 communicates the information to one or more of a display (e.g., display 125), a storage (e.g., storage 152), a network storage, a server (e.g., server 165), a network (e.g., network 150), a port (e.g., USB port 129), a drive (e.g., multimedia drive 127), an application (e.g., application 135), and/or a memory (e.g., memory 115), among others.

In redefining the abstraction, according to one or more embodiments, UIFSEC utility 145 determines an earliest time-frame "i" at which the values of any corresponding abstracted functions differ across the original logic (e.g., in units 210A and 210B). For example, abstracted next-state function of register 325C of unit 210A and next-state function of register 325C of unit 210B may be checked for differences.

If the abstracted next-state functions are directly being driven using UIFs (as it was on the initial abstraction, though may not be after refinement), the abstracted next-state functions may initially differ only if the UIFs produce different values. For example, the multiplexor selector signal 410 (see FIG. 4) selects signal 405 to drive the abstracted next-state function in unit 210B while signal 400 drives the abstracted next-state function in unit 210A, and this implies that the functional consistency condition for the multiplexor evaluates to "false" in the trace.

If the functional consistency condition is an "AND" over a set of equality checks over a subset of the signals in the support of the next-state function being abstracted, UIFSEC utility 145 determines which of the support equalities are falsified in the abstracted trace, and for each equality that has been falsified in the abstract trace, UIFSEC utility 145 determines whether or not the signals in the equality function differ in the original trace. In some instances, there may be at least one signal that is part of the functional consistency condition and that differs in the original trace across units 210A and 210B.

In the example illustrated in FIG. 2, the initial abstraction will abstract the following two pairs: the next-state function of register 325A of unit 210A and the next-state function of register 325A of unit 210B, and the next-state function of register 325C of unit 210A and the next-state function of register 325C of unit 210B using UIFs. The abstracted next-state functions may differ in the abstract design in cycle "0" (e.g., the first cycle), due to the difference between values of clock gating enable signal 345 in each of units 210A and 210B that may cause the equivalence check to fail. Analyzing the functional consistency condition for the next-state functions may show that the functional consistency condition failed because it included clock gating enable signal 345 as part of the functional consistency condition and clock gating enable signal 345 is driven to assertion in unit 210A and to non-assertion in unit 210B.

If multiple signals are identified in a set, an arbitrary mechanism may be used, in UIFSEC utility 145, to prune the set. For example, the set may be enumerated for all next-state functions that mismatch at the earliest time-frame and select a subset that appears most, such as one or more other sets.

After the signals that cause the functional consistency condition to fail are identified (e.g., clock gating enable signal 345), UIFSEC utility 145 may redefine the functional consistency condition, and thereby, UIFSEC utility 145 refines the UIF abstraction.

In one or more embodiments, UIFSEC utility 145 redefines the UIF abstraction as follows. Let "s1" refer to the set of signals that caused functional consistency to fail. UIFSEC utility 145 may obtain cofactors of the original function with respect to s1 (e.g., clock gating enable signal 345). A "cofactor" of a function refers to a modified function where a particular signal is replaced with a constant, e.g., the positive cofactor of logic unit 315A with respect to s1 is equivalent to logic unit 315A with s1=1 and the negative cofactor of logic unit 315A with respect to s1 is equivalent to logic unit 315A with s1=0.

The positive and negative cofactors may now become new abstraction candidates. UIFSEC utility 145 verifies that the cofactors across the two models are equivalent if the correlated signals in the support of the cofactors are identically driven across units 210A and 210B. If the checks fail for any of the cofactors, UIFSEC utility 145 replaces the bad abstraction using the original function (i.e., abstracting that given next-state function is abandoned).

The functional consistency condition for each cofactor may be identified (all correlated support signals in the COI are equivalent across units 210A and 210B) and each cofactor may be abstracted using a MUX-based abstraction circuit. Before UIFSEC utility 145 attempts to create the MUX abstraction, in one or more embodiments, UIFSEC utility 145 checks the data structure to determine whether or not the given abstraction already exists for the given next-state function. If the MUX abstraction exists, the MUX is reused along with random signals. UIFSEC utility 145 also equivalence checks (i.e., that the corresponding cofactors with correlated support drive the same values) this reuse, and if the equivalence check fails, the abstraction may be eliminated for the corresponding next-state function as above. Otherwise UIFSEC utility 145 creates a new MUX and populates the data structure with information associated with the new MUX.

In one example, the functional consistency condition for a negative cofactor of the next-state function of register 325C of unit 210A will be a logical result of an equality check of the next-state function of register 325A of unit 210A and the next-state function of register 325A of unit 210B while the functional consistency condition for a positive cofactor of the next-state function of register 325C of unit 210A will be a logical result of an equality check of the next-state function of register 325A of unit 210A and the next-state function of register 325A of unit 210B AND an equality check of the next-state function of register 325C of unit 210A and the next-state function of register 325C of unit 210B AND an equality check of instruction valid signal 350B of unit 210A and instruction valid signal 350B of unit 210B.

Figure 6:
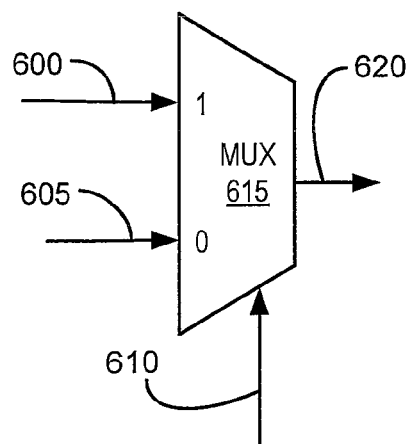
FIG. 6 illustrates a block diagram of a MUX with an initial abstraction modified, in accordance with an embodiment of the present invention.

With reference now to FIG. 6, a block diagram of a MUX is illustrated with the initial abstraction modified. As shown, the MUX 615 produces a signal 620 based on signal 610 that corresponds to signal s1, above. An input signal 600 corresponds to a positive cofactor, and an input signal 605 corresponds to a negative cofactor. It is noted that the original function will be driven using the UIF abstraction for the positive cofactor when s1 evaluates to "1" and will be driven by the UIF abstraction for the negative cofactor when s1 evaluates to 0

At this point, the method illustrated in FIG. 5 may return to 520 to perform the one or more functions on the abstract model to complete proof as being correct. If the next-state function is not abstracted using an UIF, because the UIF was previously refined, then the UIF may have been abstracted using the block diagram illustrated in FIG. 6. Accordingly, let "s2" refer to the cofactors already reflected in the refined abstraction of this next-state function. UIFSEC utility 145 may perform a check to determine whether or not the signals used for previous cofactoring-based refinement (e.g., s2) evaluates to the same value in both units 210A and 210B.

If the signals in s2 evaluate to the same values in units 210A and 210B, there may be other signals in the consistency condition for the next-state function that differ. UIFSEC utility 145 determines that the particular cofactor that correlates to the values of the s2 signals determined in the simulated trace, and UIFSEC utility 145 determines a new set of signals to cofactor and refine or to eliminate the abstraction of this next-state function. It is noted that the abstraction correlating to that cofactor may differ. In one or more embodiments, UIFSEC utility 145 performs refinement based on whether or not the abstraction for the cofactor is an UIF-based abstraction, as described above.

If s2 evaluates to different values in units 210A and 210B, then UIFSEC utility 145 performs a check to determine whether or not the abstractions corresponding to the cofactors of this next-state function are equivalent in the abstract trace. If they are equivalent, UIFSEC utility 145 may abandon the UIF-based abstraction, as the UIF-based abstraction implies that the random values driven by the UIF-based abstraction may not be totally random and may need to be constrained to the original behavior of the design.

If any of the positive and negative cofactors checked, as described above, produce different values in the abstract trace, UIFSEC utility 145 determines which differing cofactor have more signals in its functional consistency condition, and new cofactor candidates s1 from this set of signals which exist in one but not the other cofactor consistency check or determination may be selected, other than the register correlating to the next-state function being refined itself. In some instances, set s1 may be minimized as discussed above.

Returning to FIG. 5, after the refined abstraction is obtained, the method may proceed to 520 where UIFSEC utility 145 repeats performing the once or more functions on the refined abstraction to complete proof of being correct.

In one example, the abstraction corresponding to the next-state function of register 325C of unit 210A and the next-state function of register 325C of unit 210B may evaluate differently across units 210A and 210B. After the initial refinement to change the abstraction, the refined abstraction may be similar to the one illustrated in FIG. 6, where s1 is clock gating enable signal 345, and clock gating enable signal 345 evaluates differently across units 210A and 210B. The UIF abstraction corresponding to the positive cofactor has larger number of signals in its COI and as part of its functional consistency condition. The positive cofactor includes the next-state function of register 325A of unit 210A, the next-state function of register 325C of unit 210A, and instruction valid signal 350B of unit 210A as part of its functional consistency condition.

In one or more embodiments, further abstracting the UIF abstraction that has higher number of signals in its functional consistency condition may be better. UIFSEC utility 145 may perform the abstraction by cofactoring the original function that was abstracted. For instance, first may be to determine signals that may be used for cofactoring while avoiding signals that are common across the two cofactors (e.g., avoiding cofactoring the next-state function of register 325A of unit 210A) and avoiding cofactoring the register corresponding to the original next-state function of register 325C of unit 210A. Accordingly, instruction valid signal 350B of unit 210A would be precipitated. This may typically be a signal or a set of signals that enable and disable gating in the clock gating enabled design, and the particular cofactor using the block diagram illustrated in FIG. 6 using the signal or the set of signals that may be selected.

In the flow chart above, the method is embodied in a computer readable medium containing computer readable code such that a series of steps are performed when the computer readable code is executed (by a processing unit) on a computing device. In some implementations, certain processes of the method is combined, performed simultaneously, performed concurrently (e.g., performed such that timing of one or more processes of the method appear, to a person, simultaneous with other processes), and/or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the present invention may be embodied as a method, system, and/or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit", "module", "logic", or "system". Furthermore, the present invention may take the form of a computer program product on a computer-usable storage medium having computer-usable program code embodied in or on the medium.

As will be further appreciated, the processes in embodiments of the present invention may be implemented using any combination of software, firmware, microcode, and/or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture including the programming code is used by either executing the code directly from the storage device, by copying the code from the storage device into another storage device such as a hard disk, RAM, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may include, store, communicate, propagate, or transport the program for use by or in connection with the execution system, apparatus, or device. The methods of the invention may be practiced by combining one or more machine-readable storage devices including the code according to the described embodiment(s) with appropriate processing hardware to execute the code included therein. An apparatus for practicing the invention could be one or more processing devices and storage systems including or having network access (via servers) to program(s) coded in accordance with the invention. In general, the term computer, computer system, or data processing system can be broadly defined to encompass any device having a processor (or processing unit) which executes instructions/code from a medium.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media, includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for sequential equivalence checking of two netlists, the method comprising:
 a processor executing program instructions to perform the functions of:
 (a) receiving a first netlist and a second netlist of an original model, wherein each netlist of the first netlist and the second netlists includes at least one representation of one or more hardware registers coupling a plurality of gates;
 (b) determining, from netlists of the original model, logic to be abstracted;
 (c) determining a condition for functional consistency;
 (d) creating an abstract model by replacing the logic with abstracted logic using one or more uninterpreted functions;
 (e) performing one or more functions on the abstract model;
 (f) determining whether or not a counterexample is obtained from said performing the one or more functions on the abstract model;
 (g) if a counter example is not obtained, determining whether or not a proof is complete;
 (h) if the proof is complete, reporting that the proof is complete;
 (i) if the proof is not complete, repeating the method from step (e) using another function on the abstract model, wherein said another function is different from any one or more functions previously used in performing step (e);

(j) if a counter example is obtained, determining whether or not the counter example can be transferred onto the original model;
(k) if the counter example can be transferred onto the original model, reporting that the counter example can be transferred onto the original model and reporting the counter example; and
(l) if the counter example can not be transferred onto the original model:
refining the abstraction; and
repeating the method from step (e) with the abstract model including the refined abstraction.

2. The method of claim 1, wherein the one or more functions include one or more of a bounded model checking (BMC) algorithm, an interpolation algorithm, a Boolean satisfiability-based analysis algorithm, and a binary decision diagram (BDD) based reachability analysis algorithm.

3. The method of claim 1, wherein the abstracted logic includes a multiplexor.

4. The method of claim 1, wherein said determining, from the original model, the logic to be abstracted includes one or more of:
determining a first register in the first netlist and a corresponding second register in the second list;
determining a first next-state function of the first register; and
determining a second next-state function of the second register.

5. The method of claim 4, wherein said determining, from the original model, the logic to be abstracted includes determining a combinational cone of influence (COI) of the first next-state function and the second next-state function.

6. The method of claim 5, further comprising:
walking the COI to correlate signals that are different from the first register and the second register.

7. The method of claim 4, wherein:
said determining, from the original model, the logic to be abstracted includes determining a first next-state function of the first register and determining a second next-state function of the second register; and
said determining the condition for functional consistency includes determining that the first next-state function of the first register and the second next-state function of the second register are functionally equivalent when the first next-state function of the first register and the second next-state function of the second register receive a same input.

8. The method of claim 1, wherein said determining, from the original model, the logic to be abstracted includes:
determining a first register in the first netlist and a corresponding second register in the second list;
determining a first next-state function of the first register;
determining a second next-state function of the second register; and
determining a combinational cone of influence (COI) of the first next-state function and the second next-state function;
the method further comprising:
walking the COI to correlate signals that are different from the first register and the second register;
wherein said determining the condition for functional consistency includes determining the condition for functional consistency based on correlated signals in support of the COI of the first next-state function and the second next-state function and based on the first next-state function of the first register and the second next-state function of the second register being functionally equivalent.

9. The method of claim 1, wherein said refining the abstraction includes:
replacing a portion of logic of the first netlist with first abstract logic;
replacing a portion of logic of the second netlist with second abstract logic;
wherein at least one of the first abstract logic and the second abstract logic includes a multiplexor-based uninterpreted function.

10. A data processing system, comprising:
a processor;
a memory coupled to the processor;
a utility, stored in the memory, which when executed on the processor provides logic that causes the processor to:
(a) receive a first netlist and a second netlist of an original model, wherein each netlist of the first netlist and the second netlists includes at least one representation of one or more hardware registers coupling a plurality of gates;
(b) determine, from netlists of the original model, logic to be abstracted;
(c) determine a condition for functional consistency;
(d) create an abstract model by replacing the logic with abstracted logic using one or more uninterpreted functions;
(e) perform one or more functions on the abstract model;
(f) determine whether or not a counterexample is obtained from said performing the one or more functions on the abstract model;
(g) if a counter example is not obtained, determine whether or not a proof is complete;
(h) if the proof is complete, report that the proof is complete;
(i) if the proof is not complete, repeat performing the functions from step (e) using another function on the abstract model, wherein said another function is different from any one or more functions previously used in performing step (e);
(j) if a counter example is obtained, determine whether or not the counter example can be transferred onto the original model;
(k) if the counter example can be transferred onto the original model, report that the counter example can be transferred onto the original model and reporting the counter example; and
(l) if the counter example can not be transferred onto the original model:
refine the abstraction; and
repeat performing the functions from step (e) with the abstract model including the refined abstraction.

11. The data processing system of claim 10, wherein the one or more functions include one or more of a bounded model checking (BMC) algorithm, an interpolation algorithm, a Boolean satisfiability-based analysis algorithm, and a binary decision diagram (BDD) based reachability analysis algorithm.

12. The data processing system of claim 10, wherein the abstracted logic includes a multiplexor.

13. The data processing system of claim 10, wherein causing said processor to determine, from the original model, the logic to be abstracted includes causing the processor to:
determine a first register in the first netlist and a corresponding second register in the second list;
determine a first next-state function of the first register;
determine a second next-state function of the second register; and determine a combinational cone of influence (COI) of the first next-state function and the second next-state function;

the utility further comprising logic that causes the processor to:

walk the COI to correlate signals that are different from the first register and the second register;

wherein determining the condition for functional consistency includes determining the condition for functional consistency based on correlated signals in support of the COI of the first next-state function and the second next-state function and based on the first next-state function of the first register and the second next-state function of the second register being functionally equivalent.

14. The data processing system of claim 10, wherein the logic that causes the processor to refine the abstraction includes logic that causes the processor to:

replace a portion of logic of the first netlist with first abstract logic; and replace a portion of logic of the second netlist with second abstract logic;

wherein at least one of the first abstract logic and the second abstract logic includes a multiplexor-based uninterpreted function.

15. A computer program product, comprising:

a non-transitory computer-readable storage medium; and program code on said non-transitory computer-readable storage medium that when executed within a data processing device, said program code provides the functionality of:

(a) receiving a first netlist and a second netlist of an original model, wherein each netlist of the first netlist and the second netlists includes at least one representation of one or more hardware registers coupling a plurality of gates;

(b) determining, from netlists of the original model, logic to be abstracted;

(c) determining a condition for functional consistency;

(d) creating an abstract model by replacing the logic with abstracted logic using one or more uninterpreted functions;

(e) performing one or more functions on the abstract model;

(f) determining whether or not a counterexample is obtained from said performing the one or more functions on the abstract model;

(g) if a counter example is not obtained, determining whether or not a proof is complete;

(h) if the proof is complete, reporting that the proof is complete;

(i) if the proof is not complete, repeating the functionality from step (e) using another function on the abstract model, wherein said another function is different from any one or more functions previously used in performing step (e);

(j) if a counter example is obtained, determining whether or not the counter example can be transferred onto the original model;

(k) if the counter example can be transferred onto the original model, reporting that the counter example can be transferred onto the original model and reporting the counter example; and (l) if the counter example can not be transferred onto the original model:

refining the abstraction; and repeating the functionality from step (e) with the abstract model including the refined abstraction.

16. The computer program product of claim 15, wherein the one or more functions include one or more of a bounded model checking (BMC) algorithm, an interpolation algorithm, a Boolean satisfiability-based analysis algorithm, and a binary decision diagram (BDD) based reachability analysis algorithm.

17. The computer program product of claim 15, wherein the abstracted logic includes a multiplexor.

18. The computer program product of claim 15, wherein said determining, from the original model, the logic to be abstracted includes:

determining a first register in the first netlist and a corresponding second register in the second list;

determining a first next-state function of the first register;

determining a second next-state function of the second register; and determining a combinational cone of influence (COI) of the first next-state function and the second next-state function;

the method further comprising:

walking the COI to correlate signals that are different from the first register and the second register;

wherein said determining the condition for functional consistency includes determining the condition for functional consistency based on correlated signals in support of the COI of the first next-state function and the second next-state function and based on the first next-state function of the first register and the second next-state function of the second register being functionally equivalent.

19. The computer program product of claim 15, wherein said refining the abstraction includes:

replacing a portion of logic of the first netlist with first abstract logic;

replacing a portion of logic of the second netlist with second abstract logic; and wherein at least one of the first abstract logic and the second abstract logic includes a multiplexor-based uninterpreted function.

\* \* \* \* \*